(12) United States Patent
Taylor et al.

(10) Patent No.: US 10,516,248 B1
(45) Date of Patent: Dec. 24, 2019

(54) IN-PLANE JOSEPHSON JUNCTION ARRAY TERAHERTZ LASER

(71) Applicant: THE UNITED STATES OF AMERICA AS REPRESENTED BY THE SECRETARY OF THE NAVY, San Diego, CA (US)

(72) Inventors: Benjamin J. Taylor, Escondido, CA (US); Teresa H. Emery, San Diego, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 298 days.

(21) Appl. No.: 15/638,928

(22) Filed: Jun. 30, 2017

Related U.S. Application Data

(63) Continuation-in-part of application No. 15/200,674, filed on Jul. 1, 2016, now Pat. No. 10,283,695.

(51) Int. Cl.
  *H01S 3/16*  (2006.01)
  *H01L 39/02* (2006.01)
  *H01L 39/22* (2006.01)

(52) U.S. Cl.
  CPC .......... *H01S 3/1683* (2013.01); *H01L 39/025* (2013.01); *H01L 39/223* (2013.01)

(58) Field of Classification Search
  CPC .... H01S 3/1683; H01L 39/025; H01L 39/223
  See application file for complete search history.

(56) References Cited

U.S. PATENT DOCUMENTS

| | | | |
|---|---|---|---|
| 4,168,441 A | | 9/1979 | McDonald et al. |
| 5,055,158 A | * | 10/1991 | Gallagher ............... H01L 27/18 216/3 |
| 5,845,220 A | * | 12/1998 | Puthoff ................... H01Q 7/00 455/899 |
| 7,610,071 B2 | | 10/2009 | Welp et al. |
| 7,715,892 B2 | | 5/2010 | Welp et al. |
| 8,138,477 B2 | * | 3/2012 | Gregory .................... G01J 3/10 250/341.1 |
| 8,633,472 B2 | | 1/2014 | Boulaevskii et al. |

(Continued)

OTHER PUBLICATIONS

Taylor et al. "Preparation of novel HTS films and tunnel junctions for advanced C3I sensor applications." Proceedingsd vol. 9467, Micro- and Nanotechonlogy Sensors, Systems, and Applications VII. (Year: 2015).*

(Continued)

*Primary Examiner* — Paul A Wartalowicz
(74) *Attorney, Agent, or Firm* — Naval Information Warfare Center, Pacific; Kyle Eppele; Ryan J. Friedl

(57) ABSTRACT

A system includes a substrate, a high-temperature superconductor compound film disposed on the substrate, an array of superconducting regions formed within the film, a plurality of Josephson junctions formed within the film, where each Josephson junction of the plurality of Josephson junctions is formed between adjacent superconducting regions within the array of superconducting regions, and a voltage source connected to the array of superconducting regions. The plurality of Josephson junctions are separated by a distance such that they emit coherent radiation in the terahertz frequency range responsive to a voltage applied to the array of superconducting regions.

20 Claims, 4 Drawing Sheets

(56) References Cited

U.S. PATENT DOCUMENTS

| | | |
|---|---|---|
| 9,188,514 B1 | 11/2015 | Taylor |
| 2013/0222571 A1* | 8/2013 | Kychakoff ............... G01J 11/00 348/82 |
| 2015/0118604 A1 | 4/2015 | Dynes et al. |
| 2016/0149111 A1* | 5/2016 | Cybart .................. H01L 39/025 505/190 |
| 2016/0276570 A1* | 9/2016 | Chang ................... H01L 39/025 |

OTHER PUBLICATIONS

Foley, C. P., and Hilgenkamp, H., "Why NanoSQUIDs are important: an introduction to the focus issue," Supercond. Sci. Technol. 22, 064001 (2009).

De Andrade, M. C., Leese de Escobar; A.; Taylor, B. J., Berggren, S., Higa, B., Dinh, S., Fagaly, R. L., Talvacchio, J., Nechay, B., and Przybysz, J., "Detection of Far Field Radio Frequency Signals by Niobium Superconducting Quantum Interference Device Arrays," IEEE Trans. Appl. Supercond, submitted (2015).

Berggren, S., Fagaly, R. L.; and Leese de Escobar, A. M., "Superconducting Quantum Interference Devices Arranged in Pyramid Shaped Arrays," IEEE Trans. Appl. Supercond. 25, 1600605 (2015).

S. Y. Yang, et al., "Above-bandgap voltages from ferroelectric photovoltaic devices," Nature Nanotechnology, 5, 143 (2010).

Lindemer, T. B., Hunley, J. F., Gates, J. E., Sutton Jr., A. L., Brynestad, J., Hubbard, C. R., and Gallagher, P. K., "Experimental and Thermodynamic Study of Nonstoichiometry in <YBa2Cu3O7x>," J. Am. Ceram. Soc. 72, 1775 (1989).

Wu, C. H., Jhan, F. J., Chen, J. H., and Jeng, J. T., "High-Tc Josephson junctions fabricated by focused ion beam direct milling," Supercond. Sci. Technol. 26, 025010 (2013).

Baetzold, R. C., "Atomistic simulation of ionic and electronic defects in YBa2Cu3O7," Phys. Rev. B 38, 11304 (1988).

Chandrasekhar, N., Valls, O. T., and Goldman, A. M., "Charging effects observed in YBa2Cu3O7?x films: Influence of oxygen ordering," Phys. Rev. B 49, 6220 (1994).

Grigelionis, G., Tornau, E. E.; and Rosengren, A. "Effect of an electric field on oxygen ordering and superconducting temperature of YBa2Cu3O6+x thin films," Phys. Rev. B 53, 425 (1996).

Liang, R., Bonn, D. A., and Hardy, W. N., "Evaluation of CuO2 plane hole doping in YBa2Cu3O6+x single crystals," Phys. Rev. B 73, 180505(R) (2006).

De Fontaine, D., Cedar, G., and Asta, M. , "Low-temperature long-range oxygen order in YBa2Cu3Oz," Nature 343, 544 (1990).

McCormack, R. , de Fontaine, D., and Ceder, G., "Oxygen configurations and their effect on charge transfer in off-stoichiometric YBa2Cu3Oz," Phys. Rev. B 45, 12976 (1992).

De Fontaine, D., Ozolins, V. , Islam, Z., and Moss, S. C., "Origin of modulated structures in YBa2Cu3O6:63: A first-principles approach," Phys. Rev. B 71, 212504 (2005).

Michalowski, P., Shapoval, T., Meier, D., Katzer, C., Schmidl, F., Schutz, L., and Seidel, P., "Enhancement of high-Tc superconducting thin film devices by nanoscale polishing," Supercond. Sci. Technol. 25, 115019 (2012).

Mitchell, E. E., and Foley, C. P., "YBCO step-edge junctions with high IcRn," Supercond. Sci. Technol. 23, 065007 (2010).

Du, J., Lazar, J. Y., Lam, S. K. H., Mitchell, E. E. and Foley, C. P., "Fabrication and characterisation of series YBCO step-edge Josephson junction arrays," Supercond. Sci. Technol. 27, 095005 (2014).

Cybart, S. A., Cho, E. Y., Wong, T. J., Glyantsev, V. N., Huh, J. U., Yung, C. S., Moeckly, B. H., Beeman, J.W., Ulin-Avila, E., Wu, S. M., and Dynes, R. C., "Large voltage modulation in magnetic field sensors from two-dimensional arrays of YBa—Cu—O nano Josephson junctions," Appl. Phys. Lett. 104, 062601 (2014).

Cybart, S. A., Cho, E. Y., Wong, T. J., Wehlin, B. H., Ma, M. K., Huynh, C., and Dynes, R. C., "Nano Josephson Superconducting Tunnel Junctions in Y—Ba—Cu—O Direct-Patterned with a Focused Helium Ion Beam," arXiv:1409.4876v1 (2014).

Wu, C. H., Chou, Y. T., Kuo, W. C., Chen, J. H., Wang, L. M., Chen, J. C., Chen, K. L., Sou, U. C., Yang, H. C., and Jeng, J. T., "Fabrication and characterization of high-Tc YBa2Cu3O7? nanoSQUIDs made by focused ion beam milling," Nanotechnology 19, 315304 (2008).

Arpaia, R., Arzeo, M., Nawaz, S., Charpentier, S., Lombardi, F., and Bauch, T., "Ultra low noise YBa2Cu3O7 nano superconducting quantum interference devices implementing nanowires," Appl. Phys. Lett. 104, 072603 (2014).

Sirena, M., Matzen, S., Bergeal, N., Lesueur, J., Faini, G., Bernard, R., Briatico, J., and Crete, D. G. "Improving ion irradiated high Tc Josephson junctions by annealing: The role of vacancy-interstitial annihilation," Appl. Phys. Lett. 91, 142506 (2007).

MoberlyChan, W. J., Adams, D. P., Aziz, M. J., Hobler, G., and Schenkel, T., "Fundamentals of Focused Ion Beam Nanostructural Processing: Below, At, and Above the Surface," MRS Bulletin 32, 424 (2007).

Blamire, M. G., MacManus-Driscoll, J. L., Mathur, N. D., and Barber, Z. H., "The Materials Science of Functional Oxide Thin Films," Adv. Mater. 21, 3827 (2009).

Cojocaru, C.-V., Nechache, R., Hamagea, C., Pignolet, A., and Rosei, F., "Nanoscale patterning of functional perovskite-type complex oxides by pulsed laser deposition through a nanostencil," Appl. Surf. Sci. 256, 4777 (2010).

Chen, H. H., Urquidez, O. A., Ichim, S., Rodriquez, L. H., Brenner, M. P., Aziz, M. J., "Shocks in Ion Sputtering Sharpen Steep Surface Features," Science 310, 294 (2005).

R. Arpaia, S. Nawaz, F. Lombardi, and T. Bauch, "Improved Nanopatterning for YBCO Nanowires Approaching the Depairing Current", IEEE Trans. Appl. Supercon. vol. 23, issue 3, 2013.

I. Kakeya, Y. Omukai, T. Yamamoto, K. Kadowaki, M. Suzuki, "Effect of thermal inhomogeneity for terahertz radiation from intrinsic Josephson junction stacks of Bi2Sr2CaCu2O8δ", Appl. Phys. Lett. 100, 242603 (2012).

H. Minami, I. Kakeya, H. Yamaguchi, T. Yamamoto, K. Kadowaki, Characteristics of terahertz radiation emitted from the intrinsic Josephson junctions in high-superconductor Bi2Sr2CaCu2O8δ, Appl. Phys. Lett. 95, 232511 (2009).

L. Ozyuzer, A.E. Kosheiev, C. Kurter, N. Gopalsami, O.A. Li, M. Tachiki, K. Kadowaki, T. Yamashita, T. Tachiki, K.E. Gray, W.K. Kwok, U. Welp, "Emission of Coherent Terahertz Radiation from Superconductors", Science 318, 291 (2007).

K. Kadowaki, M. Tsujimoto, K. Yamaki, T. Yamamoto, T. Kashiwagi, H. Minami, M. Tachiki, R.A. Klemm; "Evidence for a Dual-Source Mechanism of Terahertz Radiation from Rectangular Mesas of Single Crystalline Bi2Sr2CaCu2O8þ Intrinsic Josephson Junctions", J Phys. Soc. Jpn. 79, 023703 (2010).

T.M. Benseman, A.E. Koshelev, K.E. Gray, W.K. Kwok, U. Welp, K. Kadowaki, M. Tachiki, T. Yamamoto, "Tunable terahertz emission from Bi2Sr2CaCu2O8+δ mesa devices". Phys. Rev. B 84, 064523 (2011).

H.B. Wang, S. Guenon, J. Yuan, A. Ishii, S. Arisawa, T. Hatano, T. Yamashita, D. Koelle, R. Kleiner, "Hot Spots and Waves in Bi2Sr2CaCu2O8 Intrinsic Josephson Junction Stacks: A Study by Low Temperature Scanning Laser Microscopy", Phys. Rev. Lett. 102, 017006 (2009).

M. Tsujimoto, K. Yamaki, K. Deguchi, T. Yamamoto, T. Kashiwagi, H. Minami, M. Tachiki, K. Kadowaki, R.A. Klemm, "Geometrical Resonance Conditions for THz. Radiation from the Intrinsic Josephson Junctions in Bi2Sr2CaCu2O8þ ", Phys. Rev. Lett. 105, 037005 (2010).

H.B. Wang, S. Guenon, B. Gross, J. Yuan, Z.G. Jiang, Y.Y. Zhong, M. Grunzweig, A. Ishii; P.H. Wu, T. Hatano, D. Koelle, R. Kleiner, "Coherent Terahertz Emission of Intrinsic Josephson Junction Stacks in the Hot Spot Regime", Phys. Rev. Lett. 105, 057002 (2010).

* cited by examiner

IN-PLANE JOSEPHSON JUNCTION ARRAY TERAHERTZ LASER

CROSS-REFERENCE TO RELATED APPLICATIONS

This application is a continuation-in-part of U.S. patent application Ser. No. 15/200,674 filed Jul. 1, 2016, entitled "Method for Creating High-Resolution Micro-To Nano-Scale Structures in High-Temperature Superconductor Films", the content which is fully incorporated by reference herein.

FEDERALLY SPONSORED RESEARCH AND DEVELOPMENT

This invention is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 103990.

BACKGROUND

A direct link from cryogenic circuitry and devices is a goal of the quantum computing community and is important for the widespread adoption of superconducting technology into various sensing and wide-band communication applications. Cryogenic circuits and/or sensors must communicate with networks operating at room temperature. This implies the use of electro-optical circuits and/or optical fiber technology for the egress of large bandwidth high-speed data/signals. There is a need for a system that, among other useful benefits, can provide a direct data link between cryogenic platforms and room temperature electronics.

DETAILED DESCRIPTION OF SOME EMBODIMENTS

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

The disclosed embodiments involve a sub-micron-scale coherent terahertz (THz) laser comprising a high-density array of high-Temperature (high-$T_c$) superconducting Josephson junctions (JJs) made from $YBa_2Cu_3O_x$ or chemical analogs. A THz device made from such an array of JJs enables a direct one-way link from superconducting to electro-optical circuitry. Additionally, the THz device may provide higher clock speeds on-chip for digital signal processing utilizing next-generation superconducting circuitry. The frequency and amplitude of the THz laser emission can be modulated by voltage from an on-chip superconducting circuit or device. The THz laser described further below may be applicable as an on-stage intermediary device for a milli-Kelvin (K) or 4 K system, as an on-chip voltage-optical conversion circuit for a 77 K platform, or as a continuous wave THz local oscillator, i.e., a precision THz clock signal.

Figure 1:
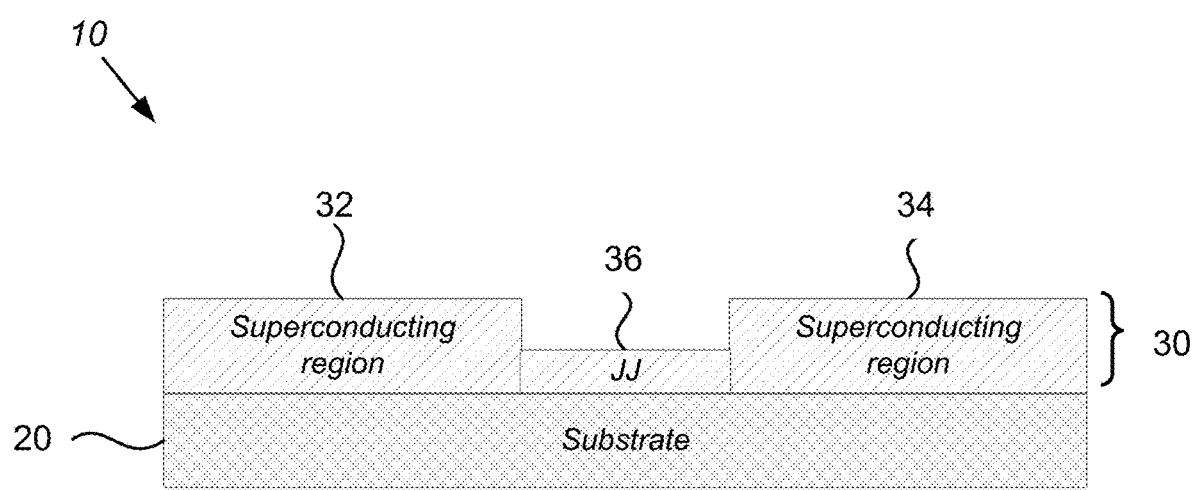
FIG. 1 shows a side cross-section view of an embodiment of a nano-wire/nano-plane type Josephson junction (JJ).

FIG. 1 shows a side cross-section view of an embodiment of a nano-wire/nano-plane type JJ device 10. Device 10 includes a substrate 20 having a film 30 disposed thereon. Commercially available substrates of thickness between about 0.5 mm and about 1 mm are typically used; however the substrates may be considerably thinner or thicker. Typical reported film thickness used for the formation of High-$T_c$ nano-wire JJ bridges ranges from about 10 nm to about 100 nm, but can be thicker to the extent that film quality can be maintained, potentially up to about 1000 nm with appropriate film processing. The widths of nano-wires are typically between about 50 nm to about 150 nm. Nano-plane type JJs can be made from films with a wide range of thickness. However, because the thickness of the nano-plane type JJ must be ion-milled to below about 70 nm in order to suppress superconductivity (10-30 nm thickness is anticipated to be ideal) the films 30 will most commonly be of a thickness of between about 100 nm and about 200 nm.

Film 30 has superconducting regions 32 and 34 formed therein. A JJ 36 formed is between superconducting regions 32 and 34. As an example, JJ 36 may be formed by ion milling. As shown, JJ 36 is dimensionally constrained compared to superconducting regions 32 and 34. Device 10 serves as a building block for the device shown in FIGS. 2 and 3.

In some embodiments, substrate 20 comprises one of aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodynium gallate ($NdGaO_3$), strontium lanthanum aluminate ($SrLaAlO_3$), strontium lanthanum gallate ($SrLaGaO_3$), ytterbium aluminate ($YtAlO_3$), and yttria- ($Y_2O_3$)-stabilized zirconia ($ZrO_2$) (YSZ). However, it should be recognized that substrate 20 may comprise other chemically-similar materials as would be recognized by a person having ordinary skill in the art.

In some embodiments, film 30 comprises a high-temperature superconductor compound belonging to the class of compounds having a compositional form of $R_{1-y}M_yBa_2Cu_{3-z}T_zO_x$, where x is oxygen content and $6 \leq x \leq 7$, wherein $0 \leq y \leq 1$, where $0 \leq z \leq 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn). As an example, film 30 is comprised of the low-anisotropic high-$T_c$ compound $YBa_2Cu_3O_7$.

Figure 2:
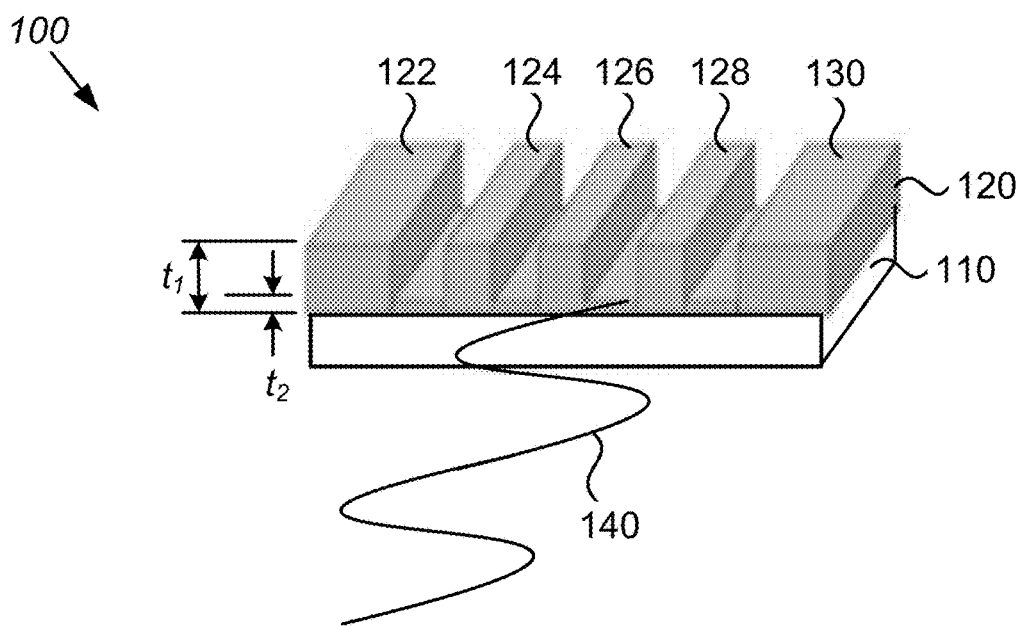
FIG. 2 shows a front perspective view illustrating an embodiment of a JJ laser and produced emission in accordance with the disclosed embodiments, where a long JJ is formed between narrow superconducting connecting regions.
Figure 3:
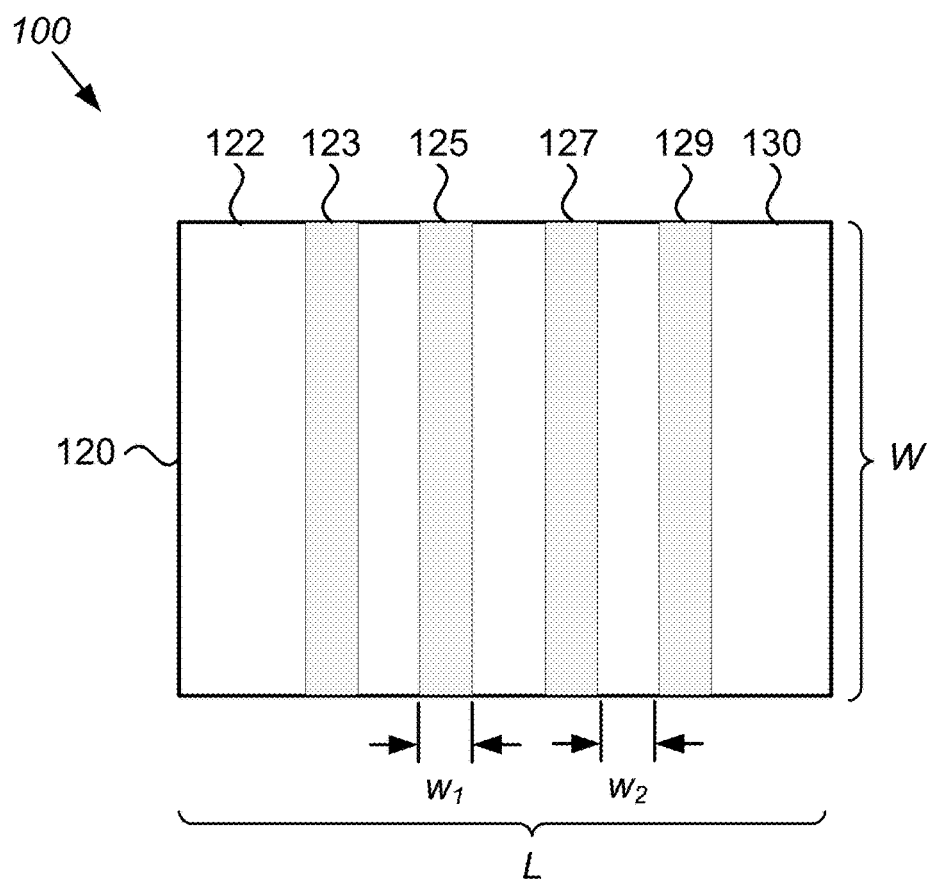
FIG. 3 shows a top view of the JJ laser shown in FIG. 2.

FIGS. 2-5 show embodiments of an in-plane Josephson junction array THz laser. Referring to FIGS. 2 and 3, FIG. 2 shows a front perspective view and FIG. 3 shows a top view of an embodiment of a JJ laser 100 which includes a substrate 110 and a film 120 disposed on substrate 110. Substrate 110 may be configured the same as or similar to substrate 20 shown in FIG. 1. Film 120 may be configured the same as or similar to film 30 shown in FIG. 1. As an example, substrate 110 may have a thickness between about 0.5 mm and about 1 mm. Additionally, film 120 may have a thickness $t_1$ of between about 100 nm to about 1000 nm. As an example, the width W of JJ laser 100 may be between about 4 μm and about 40 μm. The length L of JJ laser 100 may vary depending upon how many superconducting regions and JJs are desired. As an example, L may be any value between a range of about 1 μm and about 100 μm.

Film 120 has an array of superconducting regions 122, 124, 126, 128, and 130 formed therein and a plurality of JJs 123, 125, 127, and 129 formed within the film between superconducting regions. Each separate JJ is formed along a trenched section of film 120 between adjacent superconducting regions within the array of superconducting regions. As shown, JJ 123 is located between superconducting regions 122 and 124, JJ 125 is located between superconducting regions 124 and 126, JJ 127 is located between superconducting regions 126 and 128, and JJ 129 is located between superconducting regions 128 and 130.

As an example, each JJ has a thickness $t_2$ of between about 10 nm to about 30 nm. Further, the width $w_1$ of each of the plurality of JJs 123, 125, 127, and 129 may be between about 20 nm and about 300 nm and the width $w_2$ of each of the superconducting regions 122, 124, 126, 128, and 130 may be between about 30 nm and about 50 nm.

Figure 6:
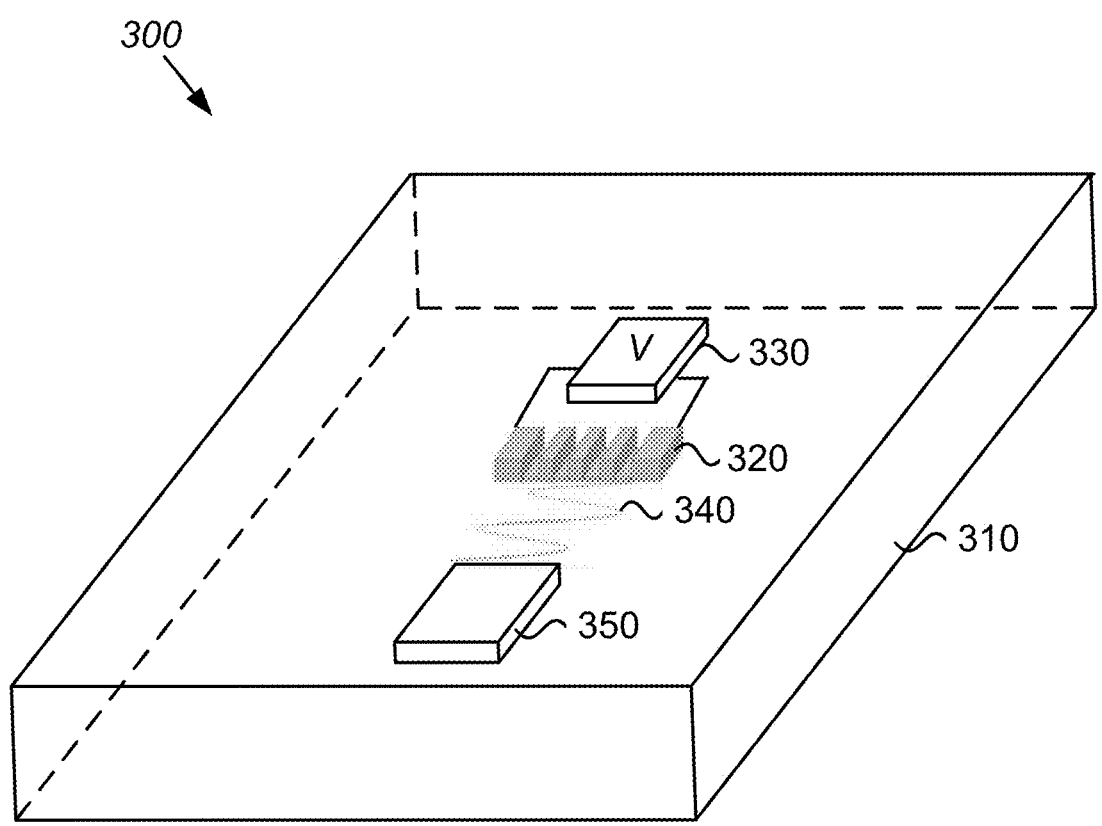
FIG. 6 shows a front perspective view illustrating an embodiment of a system in accordance with the disclosed embodiments, the system including a JJ laser, a voltage source, and a waveguide for insertion of a signal into a THz waveguide or opto-electronic circuitry.

THz emission 140 is produced from the JJs when a voltage is applied (see for example FIG. 6). THz emission 140 may be produced and controlled in an analogous manner to that established for vertical JJ stacks. However, the design of JJ laser 100 is advantageous in that it can produce THz emission 140, without using vertically-oriented JJ stacks, through the use of the array of superconducting regions and JJs in a single film.

Figure 4:
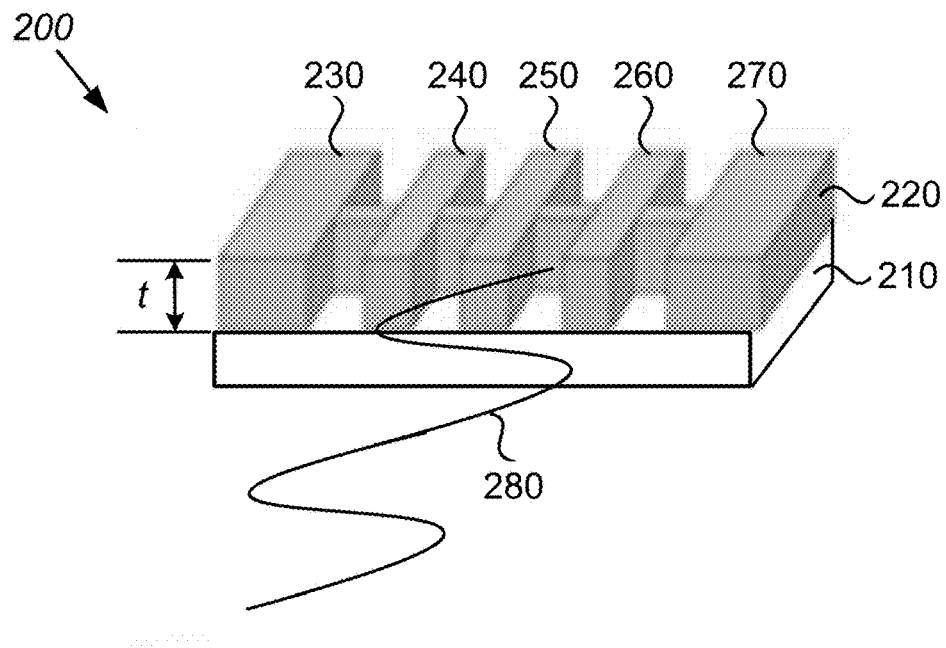
FIG. 4 shows a front perspective view illustrating an embodiment of a JJ laser and produced emission in accordance with the disclosed embodiments, where each JJ is a nano-wire located between narrow superconducting connecting regions.
Figure 5:
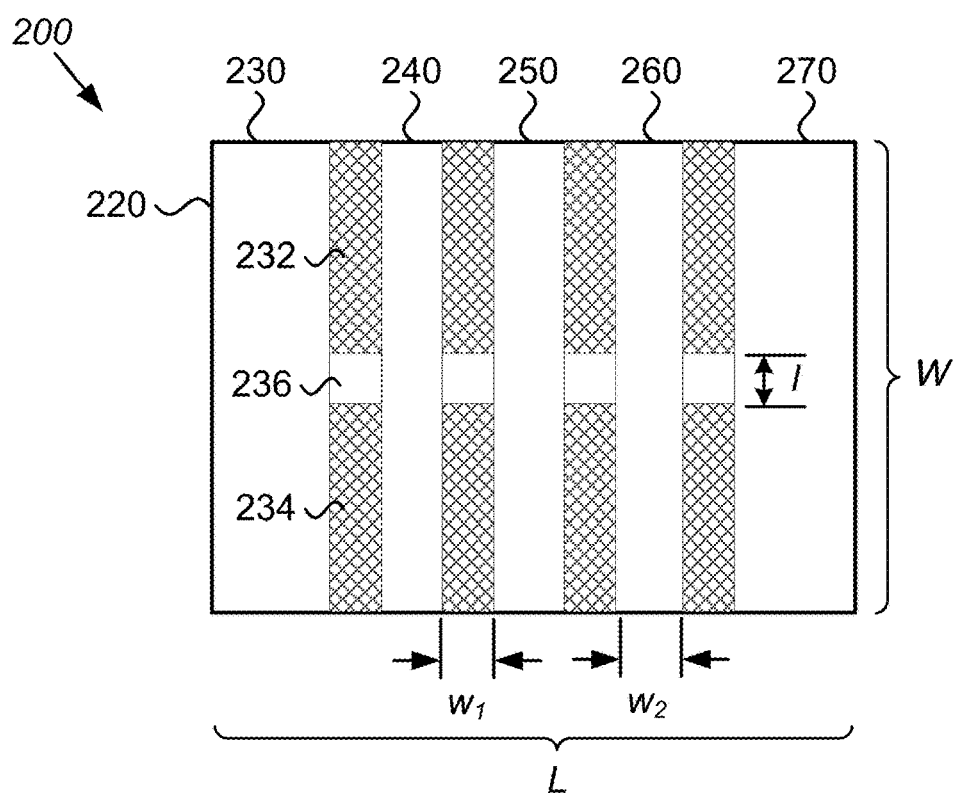
FIG. 5 shows a top view of the JJ laser shown in FIG. 2.

Referring to FIGS. 4 and 5, FIG. 4 shows a front perspective view and FIG. 5 shows a top view of an embodiment of a JJ laser 200 and produced emission 280 in accordance with the disclosed embodiments. Each JJ is a nano-wire located between narrow superconducting connecting regions. The plurality of JJs comprise very thin, Dayem-bridge-like weak link JJs. JJ laser 200 includes a substrate 210 having a film 220 with an array of superconducting regions 230, 240, 250, 260, and 270 formed therein. A plurality of JJs is formed within film 220 between the superconducting regions.

Substrate 210 may be configured the same as or similar to substrate 20 shown in FIG. 1. Film 220 may be configured the same as or similar to film 30 shown in FIG. 1. As an example, substrate 210 may have a thickness between about 0.5 mm and about 1 mm. Additionally, film 220 may have a thickness t of between about 10 nm to about 100 nm. Length L of JJ laser 200 may vary depending upon the desired size of the device. As an example, L may be any value between a range of about 1 μm and about 100 μm. As an example, the width W of JJ laser 200 may be between about 1 μm and about 100 μm.

JJs are formed by dimensionally constraining the film in the in-plane direction such that each JJ is a nano-wire located between narrow, but fully superconducting connecting regions.

For example, FIG. 5 shows a region comprising portions 232 and 234 between superconducting regions 230 and 240. A JJ 236 is formed between portions 232 and 234. Portions 232 and 234 represent areas where film 220 has been removed down to substrate 210 such that all that remains of film 220 between superconducting regions 230 and 240 is JJ 236. A JJ is located between each of the plurality of superconducting regions 230, 240, 250, 260, and 270 as shown in FIG. 5.

As an example, the JJs each may have a length l of about 50 nm to about 150 nm and a width $w_1$ of between about 20 nm and about 300 nm. Further, each of the plurality of superconducting regions 230, 240, 250, 260, and 270 may have a width $w_2$ of between about 30 nm and about 50 nm. It should be recognized however, that these dimensional values may be adjusted depending on the temperature at which a device is operated. Key interrelated parameters such as critical current density, magnetic penetration depth, and superconducting coherence length are temperature (and magnetic field) dependent and their values will determine when Josephson tunneling will occur across a dimensionally constrained (i.e., nano-wire or nano-plane) region.

THz emission 280 may be produced and controlled in an analogous manner to that established for vertically-oriented JJ stacks; however, the design of JJ laser 200 is advantageous in that it does not require vertical JJ stacks. Coherent THz radiation can be produced from intrinsic JJs in highly anisotropic high-$T_c$ superconductors wherein the tunneling process occurs between the separated two-dimensional (2-D) superconductive layers inherent to the crystal lattice structure. Because the out-of-plane tunneling process proceeds between layers orthogonal to the crystal lattice long axis, the geometry of the junctions is effectively that of 2-D sheets stacked upon each other, and thus are commonly referred to as JJ stacks. JJ laser 200 may include of a long array of nano-scale ion-milled JJs wherein the tunneling process remains in the 2-D superconducting plane. The JJs are spaced tens of nanometers apart such that the coupling strength between the manufactured in-plane junctions is close to that found between the 2-D superconducting layers in highly anisotropic high-$T_c$ superconductors.

For example, at a temperature of 77 K the magnetic penetration depth of optimally doped $YBa_2Cu_3O_x$ is $\lambda \approx 150$ nm, hence the width of the superconducting region (separation between the JJs) should be less than this value so that quasiparticles generated by one junction induce a variation across adjacent junctions, acting as a coupling force, and vice versa. A separation distance of $\approx 30$ nm is chosen, as it is physically realizable using existing ion-milling technology. The frequency and amplitude of the THz laser emission can be modulated by voltage from an on-chip superconducting circuit or device. The value of the operating voltage about which a modulation of the voltage would be used depends on the number of junctions in series. Depending on the operating temperature, a typical value of ~100 V-500 V is required to put an optimally doped $YBa_2Cu_3O_x$ JJ in the resistive state, which is required for THz emission. Given a device with 1000 JJs, this would correspond to ~0.1 V-0.5 V to operate. For reference, mesa-type JJ stacks are reported to operate at ~0.7 V.

The above-described JJ laser devices have three distinct advantages over previous devices including that the JJ stack lasers can only be fabricated from highly anisotropic high-$T_c$ materials, typically from the bismuth (Bi) family of superconducting cuprate perovskites. Existing high-$T_c$ superconducting circuitry is exclusively made using the compound $YBa_2Cu_3O_x$, due to the ease of fabrication. In contrast, it is especially difficult to make films and circuits with Bi-based superconducting compounds. It is possible that the devices described above could also be used as a low-power THz signal to voltage signal converter through an absorption process.

The JJs disclosed herein may be formed using the embodiments of the methods described in pending U.S. patent application Ser. No. 15/200,674 filed Jul. 1, 2016, entitled "Method for Creating High-Resolution Micro-To Nano-Scale Structures in High-Temperature Superconductor Films", which is incorporated by reference herein in its entirety. As an example, the JJs described herein may be produced using high-resolution structural features in films of high-Temperature (high-$T_c$) superconducting compounds. One example of such a compound is $YBa_2Cu_3O_x$ ($6 \leq x \leq 7$) (YBCO). One example of the type of structure that may be created is a trench along the film such as shown in FIGS. 2 and 3. The high-resolution, sharp profile ion milled trenches are observed to form under direct, unmasked exposure of a YBCO film to a focused ion beam source when the film has oxygen concentrations at and below the concentration of $x \approx 6.72$. The structures may be relatively large (~100 µm) or small (~10 nm). The ability to produce nm-scale structures is relevant to the production of devices having a large number of JJs on films of YBCO.

As an example, for the production of high resolution features in general, the system as shown and described in U.S. Pat. No. 9,188,514 entitled "System and method for producing a sample having a monotonic doping gradient of a diffusive constituent or interstitial atom or molecule" may be used, and the following steps may be performed; 1) a film of YBCO is grown in a low oxygen state; 2) the film is directly exposed to a focused ion beam; and 3) the film is re-annealed to the desired high oxygen content state.

As a further example, to produce a Dayem bridge JJ, the following steps may be utilized: 1) growth of a YBCO film with a uniform low oxygen content, either below $x \approx 6.72$ or 6.33, as desired or 1a) If the application of pressure proves to be required, then the YBCO film is to be initially grown with $x \approx 7$, then pressure is applied and the film is re-annealed in a reduced atmosphere to achieve a uniform low oxygen content over a region of the film, either below $x \approx 6.72$ or 6.33, as desired; 2) the film is removed from the pressure apparatus and annealing chamber and transferred to an ion milling chamber; 3) the film is then exposed to a focused ion beam to completely remove some regions entirely, and other regions partially, to form circuit paths, and Dayem bridge JJs, respectively; and 4) the film is transferred back to the annealing chamber and the film temperature and oxygen atmospheric pressure are set to achieve the desired final oxygen content (typically $x \approx 6.91$). With the level of precision achievable via the above-described, method it is possible to produce large numbers of uniform JJs (~$10^6/cm^2$) having the Dayem-bridge geometry on a single chip.

The embodiments of the JJ laser described herein comprise other compounds with diffusive constituent atoms or molecules and having well-ordered low-dimensional sublattice structures. The relatively large ion milled regions described above (~100 µm wide, 10 µm deep) can potentially be re-filled through a multi-layer/lithographic process or with the use of micro-/nano-stencils for the purpose forming integrated microelectronic devices utilizing $YBa_2Cu_3O_{7-\delta}$ and structurally/growth compatible functional oxides, i.e., multi-ferroic, optical, ferro-electric, etc., perovskite oxide compounds.

In some embodiments, the described method may be used to help create high-temperature superconducting circuits and devices with intrinsic superconducting p-n like junctions. The physical boundary between structural quantum super-lattice states is used to create a centimeter scale in length p-n like junction that can then be incorporated into superconducting circuitry in various functional configurations. Using a method described in part in U.S. Pat. No. 9,188,514 to Taylor, a film of the high-Temperature superconducting compound $YBa_2Cu_3O_x$ [$6 \leq x \leq 7$] (and analogous materials) is prepared so that two adjacent regions are created having oxygen content of $x=7$ and $x\sim6.81$, corresponding to the quantum super-lattice states referred to as <1> and <$1^4 0$> respectively.

FIG. 6 shows a diagram of a system 300 including a substrate 310 having a JJ laser 320, a voltage source 330, and electronic circuitry 350 disposed thereon. As an example, substrate 310 may be configured the same as substrate 20 shown in FIG. 1. JJ laser 320 may be configured the same as that shown in FIG. 2. Voltage source 330 is connected to the array of superconducting regions of JJ laser 320 to cause the plurality of JJs within JJ laser 320 to emit coherent radiation 340 responsive to a voltage applied to the array of superconducting regions. While voltage source 330 is connected to the superconducting regions at the ends of JJ laser 320, it should be recognized by a person having ordinary skill in the art that more than one voltage source may be used and the connection points may vary.

Electronic circuitry 350 is disposed adjacent to the plurality of JJs within JJ laser 320 and is configured to receive the radiation 340 emitted from the plurality of JJs. Radiation 340 may be in a particular frequency range depending upon the configuration of JJ laser 320. The frequency at which the JJ laser will emit depends upon the method for achieving resonant conditions. Resonant emission may be accomplished through either a coupling of the Josephson junction array circuit to an external resonant structure, or through a matching to the resonant cavity frequency, which is determined by the dimensions of the cavity. In the case of JJ-stacks, the dimension of the cavity is the width and length of the mesa structure. However, due to the geometry of the nano-wire/nano-plane JJ laser, the cavity length is set by the thickness of the film (nano-wire)/thickness of the junction (nano-plane) and the width of the superconducting material connecting the Josephson junctions. For example, in some embodiments the JJs of JJ laser 320 may have physical dimensions such that the plurality of JJs emit radiation in the terahertz frequency range. In some embodiments the resonant conditions may be met through matching to an external circuit such that the plurality of JJs emit radiation having a wavelength between about 0.3 mm and 1 cm.

In some embodiments, electronic circuitry 350 comprises optical circuitry such as an optical waveguide. In some embodiments circuitry 350 comprises electrical circuitry such as a silicon micro-machined waveguide. In some embodiments circuitry 350 comprises electrical circuitry such as a micro-scale to nano-scale superconducting waveguide. While FIG. 6 shows JJ laser 320 and electronic circuitry 350 on the same substrate, in some embodiments JJ laser 320 and electronic circuitry 350 may be disposed on different substrates (e.g. different chips).

Many modifications and variations of the embodiments disclosed herein are possible in light of the above description. Within the scope of the appended claims, the disclosed embodiments may be practiced otherwise than as specifically described. Further, the scope of the claims is not limited to the implementations and embodiments disclosed herein, but extends to other implementations and embodiments as may be contemplated by those having ordinary skill in the art.

We claim:

1. A system comprising:
    a substrate;
    a film disposed on the substrate, the film comprising a high-temperature superconductor compound belonging to the class of compounds having a compositional form of $R_{1-y}M_yBa_2Cu_{3-z}T_zO_x$, where x is oxygen content and $6 \le x \le 7$, wherein $0 \le y \le 1$, where $0 \le z \le 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn);
    an array of superconducting regions formed within the film;
    a plurality of Josephson junctions formed within the film, wherein each separate Josephson junction of the plurality of Josephson junctions is formed between adjacent superconducting regions within the array of superconducting regions; and
    a voltage source connected to the array of superconducting regions for applying a voltage to the array of superconducting regions, wherein the plurality of Josephson junctions emit coherent radiation responsive to the voltage.

2. The system of claim 1 further comprising circuitry, disposed adjacent to the plurality of Josephson junctions, configured to receive the coherent radiation emitted from the plurality of Josephson junctions.

3. The system of claim 2, wherein the circuitry comprises optical circuitry.

4. The system of claim 2, wherein the circuitry comprises electrical circuitry.

5. The system of claim 2, wherein the circuitry comprises a THz waveguide.

6. The system of claim 1, wherein the substrate comprises one of:
    aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodynium gallate ($NdGaO_3$), strontium lanthanum aluminate ($SrLaAlO_3$), strontium lanthanum gallate ($SrLaGaO_3$), ytterbium aluminate ($YtAlO_3$), and yttria-($Y_2O_3$)-stabilized zirconia ($ZrO_2$) (YSZ).

7. The system of claim 1, wherein each of the plurality of Josephson junctions are formed along a trenched section of the film between adjacent superconducting regions.

8. The system of claim 1, wherein the plurality of Josephson junctions comprise Dayem-bridge Josephson junctions.

9. The system of claim 1, wherein the dimensions of the superconducting regions interconnecting the Josephson junctions are such that the plurality of Josephson junctions emit the coherent radiation in the terahertz frequency range.

10. The system of claim 1, wherein resonant conditions for coherent emission are met through matching to an external circuit such that the plurality of Josephson junctions emit the coherent radiation having a wavelength between about 0.3 mm and 1 cm.

11. The system of claim 1, wherein the voltage source is configured to be modulated to change the frequency of the coherent radiation emitted from the plurality of Josephson junctions.

12. A system comprising:
    a substrate;
    a film disposed on the substrate, the film comprising a high-temperature superconductor compound belonging to the class of compounds having a compositional form of $R_{1-y}M_yBa_2Cu_{3-z}T_zO_x$, where x is oxygen content and $6 \le x \le 7$, wherein $0 \le y \le 1$, where $0 \le z \le 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn);
    an array of superconducting regions formed within the film;
    a plurality of Josephson junctions formed within the film, wherein each Josephson junction of the plurality of Josephson junctions is formed between adjacent superconducting regions within the array of superconducting regions;
    a voltage source connected to the array of superconducting regions for applying a voltage to the array of superconducting regions, wherein the plurality of Josephson junctions emit coherent radiation responsive to the voltage, wherein the voltage source is configured to be modulated to change the frequency of the coherent radiation emitted from the plurality of Josephson junctions; and
    circuitry, disposed adjacent to the plurality of Josephson junctions, configured to receive the coherent radiation emitted from the plurality of Josephson junctions.

13. The system of claim 12, wherein the circuitry comprises optical circuitry.

14. The system of claim 12, wherein the circuitry comprises electrical circuitry.

15. The system of claim 12, wherein the circuitry comprises a THz waveguide.

16. The system of claim 12, wherein the dimensions of the superconducting regions interconnecting the Josephson junctions are such that the plurality of Josephson junctions emit the coherent radiation in the terahertz frequency range.

17. The system of claim 12, wherein resonant conditions for coherent emission are met through matching to an external circuit such that the plurality of Josephson junctions emit the coherent radiation having a wavelength between about 0.3 mm and 1 cm.

18. The system of claim 12, wherein each of the plurality of Josephson junctions are formed along a trenched section of the film between the superconducting regions.

19. The system of claim 12, wherein the plurality of Josephson junctions comprise Dayem-bridge Josephson junctions.

20. A system comprising:
   a substrate;
   a film disposed on the substrate, the film comprising a high-temperature superconductor compound belonging to the class of compounds having a compositional form of $R_{1-y}M_yBa_2Cu_{3-z}T_zO_x$, where x is oxygen content and $6 \leq x \leq 7$, wherein $0 \leq y \leq 1$, where $0 \leq z \leq 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn);
   an array of superconducting regions formed within the film;
   a plurality of Josephson junctions formed within the film, wherein each Josephson junction of the plurality of Josephson junctions is formed between adjacent superconducting regions within the array of superconducting regions, wherein resonant conditions for coherent emission are met through matching to an external circuit such that the plurality of Josephson junctions emit coherent radiation having a wavelength between about 0.3 mm and 1 cm;
   a voltage source connected to the array of superconducting regions for applying a voltage to the array of superconducting regions, wherein the plurality of Josephson junctions emit the coherent radiation in the terahertz frequency range responsive to the voltage; and
   electro-optical circuitry, disposed adjacent to the plurality of Josephson junctions, configured to receive the coherent radiation emitted from the plurality of Josephson junctions.

* * * * *